(12) United States Patent
Tsuchiya

(10) Patent No.: US 9,000,372 B2
(45) Date of Patent: Apr. 7, 2015

(54) THERMAL DETECTOR, THERMAL DETECTION DEVICE AND ELECTRONIC INSTRUMENT, AND METHOD FOR MANUFACTURING THERMAL DETECTOR

(75) Inventor: Yasushi Tsuchiya, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 145 days.

(21) Appl. No.: 13/012,906

(22) Filed: Jan. 25, 2011

(65) Prior Publication Data

US 2011/0180711 A1 Jul. 28, 2011

(30) Foreign Application Priority Data

Jan. 26, 2010 (JP) ................................. 2010-014162

(51) Int. Cl.
*H01L 27/14* (2006.01)
*G01J 5/08* (2006.01)
*G01J 5/02* (2006.01)
*H01L 27/146* (2006.01)

(52) U.S. Cl.
CPC ...... *G01J 5/08* (2013.01); *G01J 5/02* (2013.01); *G01J 5/024* (2013.01); *G01J 5/0806* (2013.01); *G01J 5/0815* (2013.01); *H01L 27/14649* (2013.01)

(58) Field of Classification Search
USPC .......... 250/338.1–4, 332, 370, 330, 342, 349, 250/340, 337
See application file for complete search history.

(56) References Cited

U.S. PATENT DOCUMENTS

| | | | |
|---|---|---|---|
| 6,184,143 B1* | 2/2001 | Ohashi et al. .................. | 438/697 |
| 6,396,580 B1* | 5/2002 | Tewes et al. .................. | 356/246 |
| 6,403,459 B1* | 6/2002 | Ohashi et al. .................. | 438/618 |
| 6,495,829 B1 | 12/2002 | Oda | |
| 6,552,344 B1* | 4/2003 | Sone et al. .................. | 250/338.1 |
| 6,750,452 B1* | 6/2004 | Morita ........................ | 250/338.1 |
| 6,949,286 B2* | 9/2005 | Nakajima et al. ............ | 428/331 |
| 7,199,343 B2* | 4/2007 | Mosley ....................... | 250/201.5 |
| 2004/0105646 A1* | 6/2004 | Fukuda et al. ................ | 385/129 |
| 2007/0158570 A1* | 7/2007 | Ohta et al. .................. | 250/338.1 |
| 2009/0050808 A1 | 2/2009 | Ushimi et al. | |

(Continued)

FOREIGN PATENT DOCUMENTS

| | | | |
|---|---|---|---|
| JP | 04-158583 A | | 6/1992 |
| JP | 06-151973 A | | 5/1994 |
| JP | 06229821 A | * | 8/1994 |

(Continued)

OTHER PUBLICATIONS

K. Wang et al.; "Time-multiplexed-plasma-etching of High Numerical Aperture Paraboloidal Micromirror Arrays"; CLEO/Pacific Rim 2003. Dec. 15-19, 2003. vol. 1, p. 317.

*Primary Examiner* — David Porta
*Assistant Examiner* — Gisselle Gutierrez
(74) *Attorney, Agent, or Firm* — Global IP Counselors, LLP

(57) ABSTRACT

A thermal detector includes a substrate, a thermal detection element and a support member. The substrate has a concave portion, a bottom surface of the concave portion forming a light-reflecting curved surface. The thermal detection element includes a light-absorbing film. The support member supports the thermal detection element with a cavity being provided between the substrate and the support member. The light-reflecting curved surface and the light-absorbing film overlap each other in plan view, the light-reflecting curved surface having a projected area in plan view larger than an area of the light-absorbing film.

9 Claims, 12 Drawing Sheets

(56) References Cited

U.S. PATENT DOCUMENTS

| | | |
|---|---|---|
| 2009/0262778 A1 | 10/2009 | Ikushima |
| 2009/0273578 A1 | 11/2009 | Kanda et al. |

FOREIGN PATENT DOCUMENTS

| | | | | |
|---|---|---|---|---|
| JP | 07-190854 A | | 7/1995 | |
| JP | 09-318436 A | | 12/1997 | |
| JP | 10062242 A | * | 3/1998 | ............... G01J 1/02 |
| JP | 10-261616 A | | 9/1998 | |
| JP | 11160146 A | * | 6/1999 | ............... G01J 1/02 |
| JP | 2000-205944 A | | 7/2000 | |
| JP | 2001-304955 A | | 10/2001 | |
| JP | 2002-113700 A | | 4/2002 | |
| JP | 2003-304005 A | | 10/2003 | |
| JP | 2005109031 A | * | 4/2005 | |
| JP | 2008-014795 A | | 1/2008 | |
| JP | 2009-271756 A | | 11/2009 | |
| JP | 2009-276402 A | | 11/2009 | |
| JP | 2009-276403 A | | 11/2009 | |
| JP | 2009-295137 A | | 12/2009 | |
| WO | 2007-129547 A1 | | 11/2007 | |
| WO | 2008-044578 A1 | | 4/2008 | |

* cited by examiner

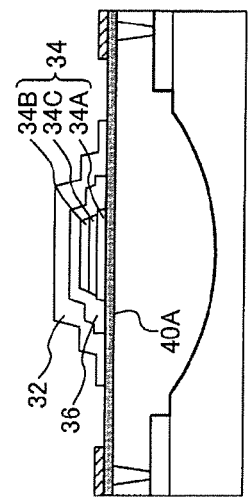
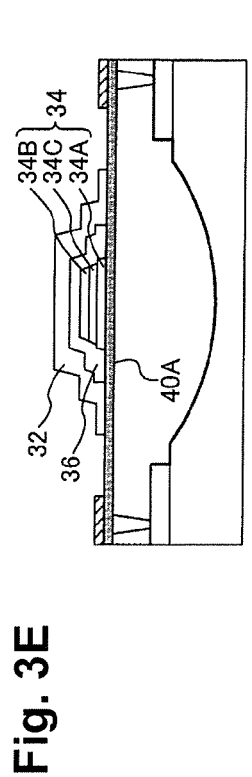
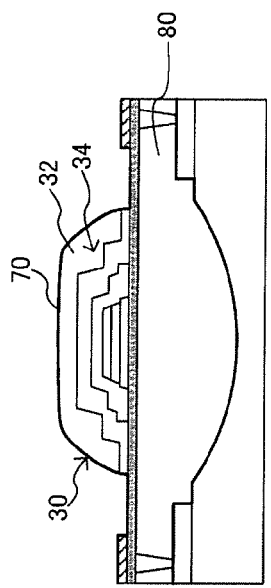
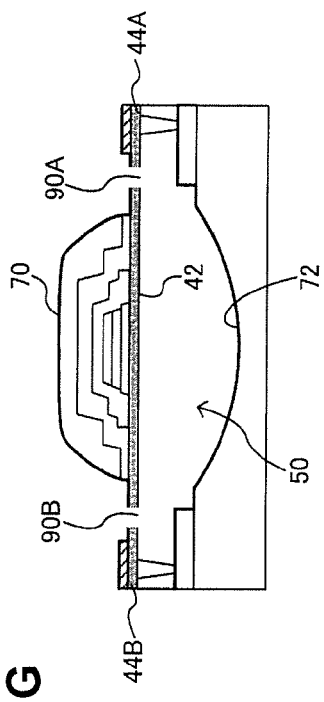
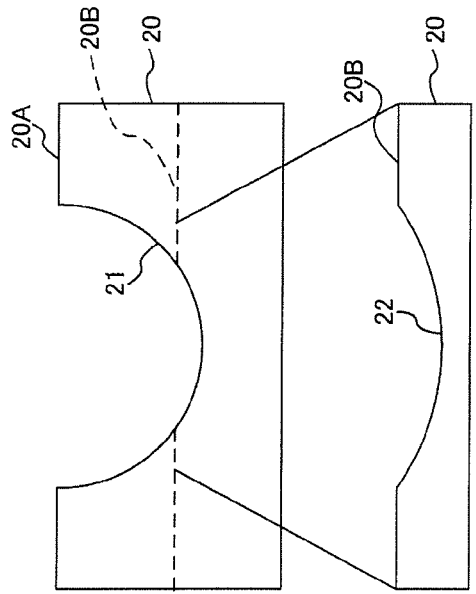
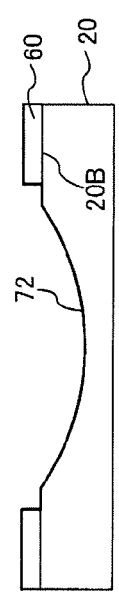
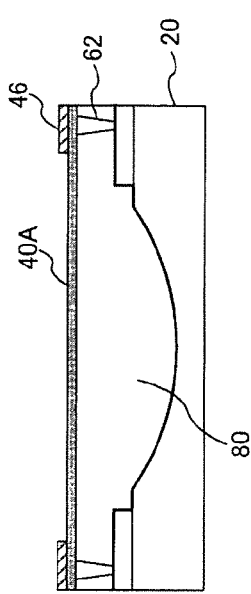
Fig. 3E   Fig. 3F   Fig. 3G
Fig. 3A   Fig. 3B   Fig. 3C   Fig. 3D

MASK FORMATION

ISOTROPIC ETCHING

MASK REMOVAL

ISOTROPIC ETCHING

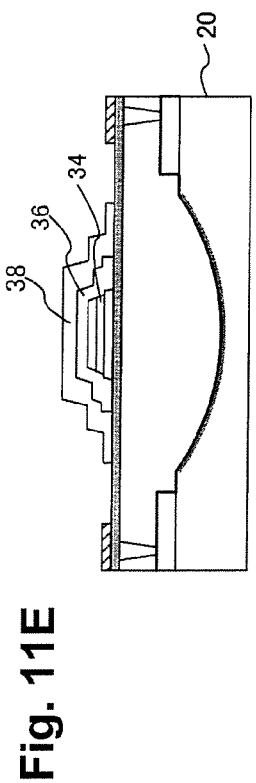
Fig. 11A
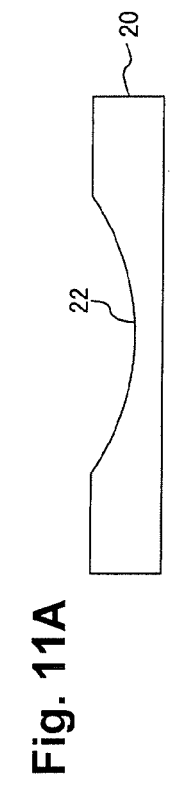
Fig. 11B
Fig. 11C
Fig. 11D
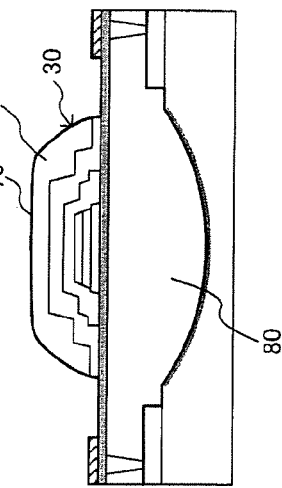
Fig. 11E
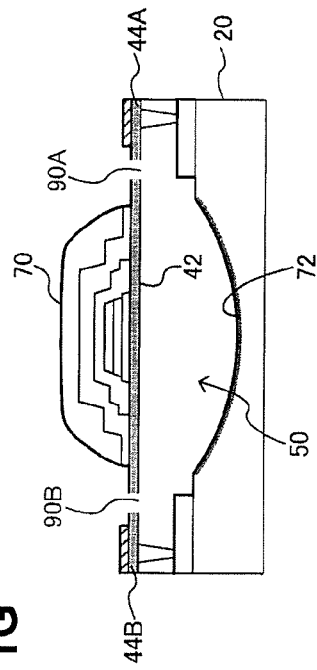
Fig. 11F
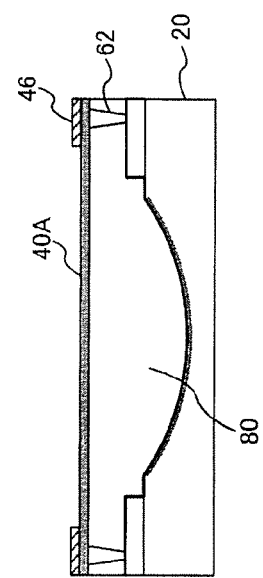
Fig. 11G

THERMAL DETECTOR, THERMAL DETECTION DEVICE AND ELECTRONIC INSTRUMENT, AND METHOD FOR MANUFACTURING THERMAL DETECTOR

CROSS-REFERENCE TO RELATED APPLICATIONS

This application claims priority to Japanese Patent Application No. 2010-014162 filed on Jan. 26, 2010. The entire disclosure of Japanese Patent Application No. 2010-014162 is hereby incorporated herein by reference.

BACKGROUND

1. Technical Field

The present invention relates to a thermal detector, a thermal detection device and electronic instrument, and to a method for manufacturing the same.

2. Related Art

Known thermal detection devices include pyroelectric or bolometer-type infrared detection devices. An infrared detection device detects infrared rays by creating an electromotive force in a detection element (pyroelectric-type) or varying a resistance value (bolometer-type) on the basis of heat evolved by infrared absorption in an infrared-absorbing film.

In order to increase the infrared absorption to enhance sensitivity, a technique has been proposed in which a diaphragm on which an infrared-absorbing film is formed is supported on a substrate via a cavity, and the distance between the infrared-absorbing film and a total reflection film formed on the substrate so as to face the cavity is set to $\lambda/4n$ ($\lambda$: infrared wavelength; n: an integer) (Japanese Laid-Open Patent Publication No. 2000-205944 (FIGS. 2 and 3)).

A structure in which a plurality of upper infrared-absorbing layers is arranged at intervals from each other on a lower infrared-absorbing layer, and reflecting films are formed on each of the upper and lower infrared-absorbing layers has also been proposed for increasing infrared absorption to enhance sensitivity (Japanese Laid-Open Patent Publication No. 2003-304005 (FIG. 2)).

A technique has also been proposed in which a first infrared-absorbing film is formed on the lateral surfaces of a V-shaped concave portion, a second infrared-absorbing film is formed on the bottom surface of the V-shaped concave portion, and infrared rays reflected by one of the first and second infrared-absorbing films are directed to the other infrared-absorbing film in order to reduce loss due to reflection on the infrared films and increase detection sensitivity (Japanese Laid-Open Patent Publication No. 7-190854 (FIG. 2)). In Japanese Laid-Open Patent Publication No. 7-190854, absorption efficiency is increased by setting the tilt angle of the V-shaped concave portion so that a total of three reflections occur at the first and second infrared-absorbing films, so as to increase the number of incidences on the infrared-absorbing films.

SUMMARY

In the technique of Japanese Laid-Open Patent Publication No. 2000-205944, first reflected infrared rays reflected by the infrared-absorbing film, and second reflected infrared rays reflected by the total reflection film each have different energy intensities, and the first and second reflected infrared rays therefore cannot be completely negated by interaction. This technique therefore has drawbacks in that a high effective absorption is not achieved by the infrared-absorbing film.

In the technique of Japanese Laid-Open Patent Publication No. 2003-304005, misalignment occurs in the patterning of the lower infrared-absorbing film and the plurality of upper infrared-absorbing films. It is therefore difficult to reduce the size of the element or increase precision when elements are arranged in a two-dimensional array.

In the technique of Japanese Laid-Open Patent Publication No. 7-190854, the depth required for the V-shaped groove to reflect a total of three times makes fabrication difficult. Misalignment also occurs in the patterning of the first and second infrared-absorbing films in the technique of Japanese Laid-Open Patent Publication No. 7-190854, the same as in the technique of Japanese Laid-Open Patent Publication No. 2003-304005. It is therefore difficult to reduce the size of the element or increase precision when elements are arranged in a two-dimensional array.

Through several embodiments of the present invention, it is possible to provide a thermal detector whereby light not absorbed by a light-absorbing film can be efficiently reflected and directed to the light-absorbing film to increase detection sensitivity, and to provide a thermal detection device and electronic instrument, and a method for manufacturing the same.

A thermal detector according to a first aspect of the present invention includes a substrate, a thermal detection element and a support member. The substrate has a concave portion, a bottom surface of the concave portion forming a light-reflecting curved surface. The thermal detection element includes a light-absorbing film. The support member supports the thermal detection element with a cavity being provided between the substrate and the support member. The light-reflecting curved surface and the light-absorbing film overlap each other in plan view, the light-reflecting curved surface having an area larger than an area of the light-absorbing film in plan view.

According to this aspect of the present invention, incident light is absorbed by the light-absorbing film, and heat evolved by absorbed infrared rays causes an electromotive force to occur in the thermal detection element (charge due to spontaneous polarization based on temperature), causes a resistance value to change, or causes another effect, whereby light may be detected by heat evolution. At this time, since a cavity is present between the substrate, which has a large heat capacity, and the support member for mounting the thermal detection element, the thermal detection element and the substrate are thermally separated, and detection is possible with minimal heat loss.

The infrared rays incident on the thermal detector of one cell include infrared rays which pass through the light-absorbing film and infrared rays which originally were not directly incident on the light-absorbing film, but the light not absorbed by the light-absorbing film is directed to the light-reflecting curved surface on the substrate side via the cavity, reflected by the light-reflecting curved surface, and directed to the light-absorbing film from the direction opposite the incidence direction via the cavity. The amount of light absorbed by the light-absorbing film is thus increased, and the amount of heat evolved based on the incident light is increased. The sensitivity of detection by the thermal detector can thereby be enhanced. The cavity can be used as an optical guide path as well as for thermal separation.

According to another aspect of the present invention, the thermal detector further comprises at least one planarizing film formed on the bottom surface of the concave portion, and a flatness of the at least one planarizing film is greater than a flatness of the bottom surface of the concave portion.

The bottom surface of the concave portion formed in the substrate sometimes has minute irregularities which cause light to reflect diffusely. Providing at least one planarizing film makes it possible to flatten the minute irregularities of the bottom surface of the concave portion and to reduce diffuse reflection. The light-reflecting curved surface in this case may be the bottom surface of the concave portion in which the irregularities have been flattened, and/or the surface of the at least one planarizing film. The reason for this is that infrared rays may sometimes be reflected even by the surface of the at least one planarizing film.

According to another aspect of the present invention, the at least one planarizing film may include an etching stopper film used when a sacrificial layer disposed in the concave portion is removed by etching.

In the manufacturing process for forming various films over the concave portion of the substrate, a sacrificial layer is formed in the concave portion of the substrate, various films are formed on the sacrificial layer, and the sacrificial layer is subsequently removed by etching. At this time, the at least one planarizing film may also be used as an etching stop layer during etching of the sacrificial layer.

According to another of the present invention, the at least one planarizing film may include a reflecting film having a higher reflectance of incident light than the substrate.

Through this configuration, the light-reflecting curved surface becomes the surface of the reflecting film which takes an active role in reflection, and the sensitivity of detection by the thermal detector can be further enhanced. The etching stopper film described above may also be formed on the surface of the reflecting film.

According to another aspect of the present invention, the bottom surface of the concave portion may be formed by a spherical surface, a parabolic surface, or a curved surface in which a curvature decreases further away from a longitudinal center line of the concave portion in a longitudinal section.

When the bottom surface of the concave portion is a spherical surface, light incident on the concave portion is reflected toward a line normal to the substrate and passing through the center of the thermal detection element. When the light-absorbing film is provided partway in the reflection path, the reflected light can be absorbed by the light-absorbing film. When the bottom surface of the concave portion is a parabolic surface, since light incident on the parabolic surface is reflected toward a single point (focus), a parabolic surface is an ideal shape for the bottom surface of the concave portion. However, in a case in which the concave portion is formed by isotropic etching of the substrate, it is difficult to accurately process the bottom surface of the concave portion into a parabolic shape. The bottom surface of the concave portion may therefore be a curved surface in which the curvature decreases the farther away from the longitudinal center line of the concave portion in a longitudinal section. When a curved surface is formed in which the curvature decreases the farther away from the longitudinal center line of the concave portion in a longitudinal section, a curved surface can be formed that more closely resembles a parabolic surface than a spherical surface.

According to another aspect of the present invention, a focus point of the parabolic surface may be positioned further toward a light-incident side of the thermal detection element than the light-absorbing film. The reason for this is that light reflected by a parabolic surface always passes through the single focus, and that reflected light coming from the side opposite the direction of light incidence always passes through the light-absorbing film on the way towards the focus.

According to another aspect of the present invention, the support member may include a mounting member mounting the thermal detection element, and at least one arm, one end of which is linked to the mounting member, and the other end of which is supported by the substrate. A wiring layer connected to the thermal detection element may be formed in the at least one arm, the wiring layer being made of material which passes incident light.

According to an aspect of the present invention, a detection signal can be retrieved from the thermal detection element by the wiring formed in at least one arm. In this arrangement, the at least one arm may be disposed outside the projected area of the light-reflecting curved surface in plan view, but by placing most of the arm on the inside of the projected area of the light-reflecting curved surface, the amount of area occupied by the thermal detector of one cell can be reduced. Furthermore, when the material forming the wiring layer is a material which passes incident light, e.g., a transparent electrode material or the like, loss in the wiring layer can be reduced, and the detection sensitivity can be increased.

The thermal detection device according to another aspect of the present invention includes the thermal detector described above arranged in two dimensions along two orthogonal axes. In this thermal detection device, since the sensitivity of detection by the thermal detector of each cell is increased, a distinct light (temperature) distribution image can be provided.

The electronic instrument according to another aspect of the present invention has the thermal detector or thermal detection device described above, and through the use of one or a plurality of cells of thermal detectors as a sensor, the electronic instrument is most suitable in thermography for outputting a light (temperature) distribution image, in automobile navigation and surveillance cameras as well as object analysis instruments (measurement instruments) for analyzing (measuring) physical information of objects, in security instruments for detecting fire or heat, in FA (Factory Automation) instruments provided in factories or the like, and in other applications.

A method for manufacturing a thermal detector according to another aspect of the present invention includes: isotropically etching a substrate having a mask layer formed on a portion of a surface thereof, and forming a first concave portion in the substrate; processing the substrate and forming a second concave portion having at least a smaller depth than the first concave portion; forming a sacrificial layer on a side of the substrate on which the second concave portion is formed; forming a support film on the sacrificial layer; forming a thermal detection element including a light-absorbing film on the support film; anisotropically etching the support film and exposing the sacrificial layer; and isotropically etching and removing the sacrificial layer.

Through this manufacturing method, a second concave portion having a smaller depth than the first concave portion, obtained by further processing the substrate having the first concave portion obtained by the isotropic etching step, can be processed into the necessary range of spherical surface, parabolic surface, or curved surface which more closely resembles a parabolic surface than a spherical surface. The bottom surface of the second concave portion can thereby be utilized as a light-reflecting curved surface. By isotropic etching of the sacrificial layer after the support layer and the thermal detection element are formed, the cavity for thermally separating the support member and the substrate is formed, and the cavity can be reserved as a path of light incidence or light reflection to the light-reflecting curved surface.

In the manufacturing method according to this aspect, the step of processing the substrate may include a step of polishing the surface of the isotropically etched substrate in which the first concave portion opens. The spherical first concave portion formed by isotropic etching can thereby be further processed so as to have a shallow depth, and a spherical surface in a range adequate for reflecting to the light-absorbing film can be reserved as the bottom surface of the second concave portion.

In the manufacturing method according to this aspect, the step of processing the substrate may include a step of removing the mask layer used during isotropic etching and again isotropically etching the substrate. The spherical first concave portion formed by isotropic etching is thus subjected to further isotropic etching together with the flat surface from which the mask layer has been removed, and a parabolic surface or a curved surface which more closely resembles a parabolic surface than a spherical surface can be obtained as the bottom surface of the second concave portion.

The manufacturing method according to this aspect may further comprise a step of forming a film for functioning as an etching stop during isotropic etching of the sacrificial layer on the second concave portion, before forming the sacrificial layer. The etching stop film may also serve as the at least one planarizing film.

The manufacturing method according to this aspect may further comprise a step of forming a reflecting film having a higher reflectance of incident light than the substrate on the second concave portion, before forming the sacrificial layer. This reflecting film further increases the reflectance at the light-reflecting curved surface and makes it possible to manufacture a thermal detector having high detection sensitivity.

BRIEF DESCRIPTION OF THE DRAWINGS

Referring now to the attached drawings which form a part of this original disclosure:

FIGS. 3A through 3G are views showing the steps of manufacturing the infrared detector shown in FIGS. 1 and 2;

FIGS. 11A through 11G are views showing the steps of manufacturing the infrared detector shown in FIG. 10.

DETAILED DESCRIPTION OF EXEMPLARY EMBODIMENTS

Preferred embodiments of the present invention will be described in detail. The embodiments described below do not unduly limit the scope of the present invention as recited in the claims, and all of the configurations described in the embodiments are not necessarily essential means of achievement of the present invention.

1. First Embodiment 1.1 Structure of the Infrared Detector

Figure 1:
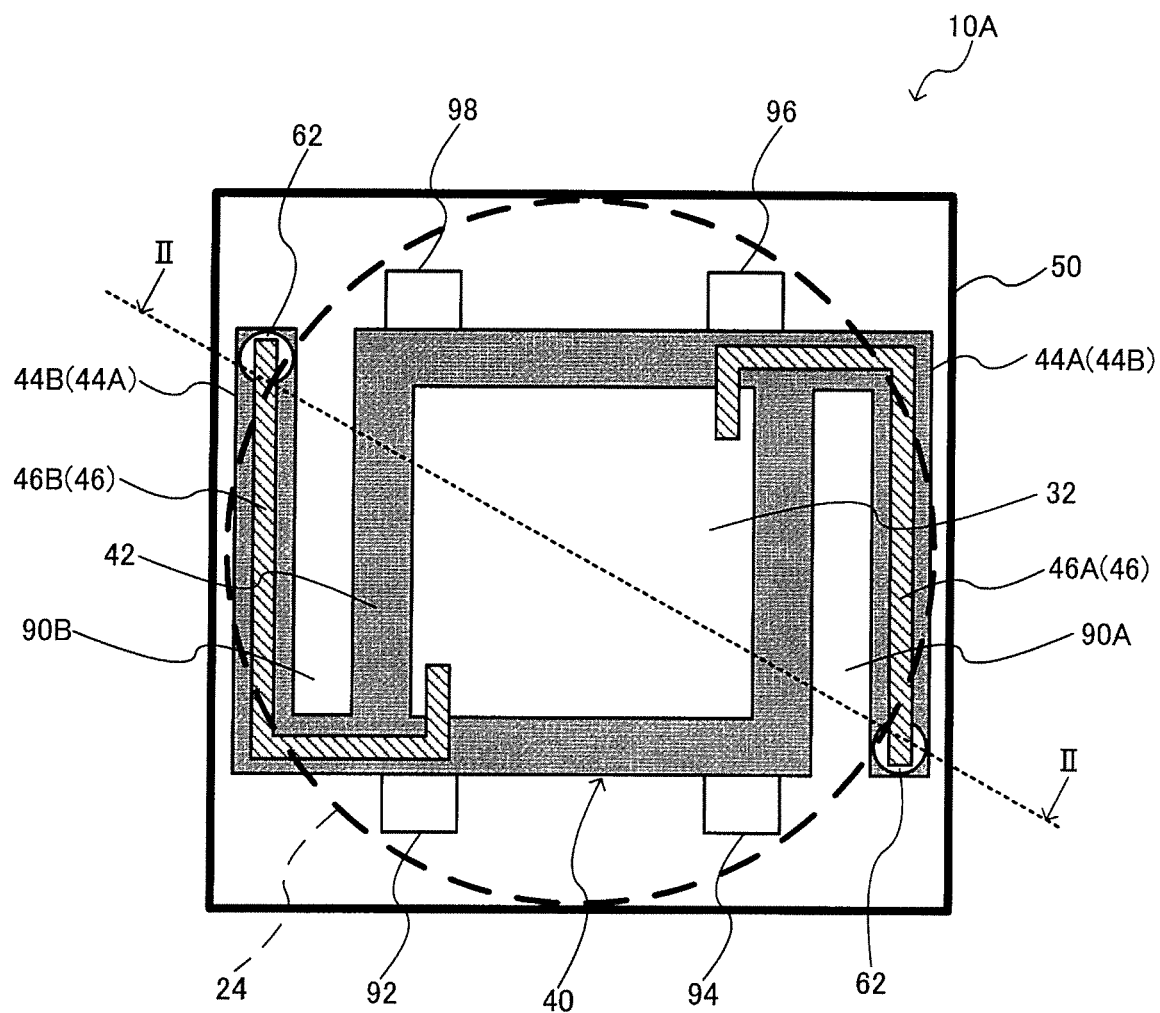
FIG. 1 is a plan view showing the infrared detector according to a first embodiment of the present invention.
Figure 2:
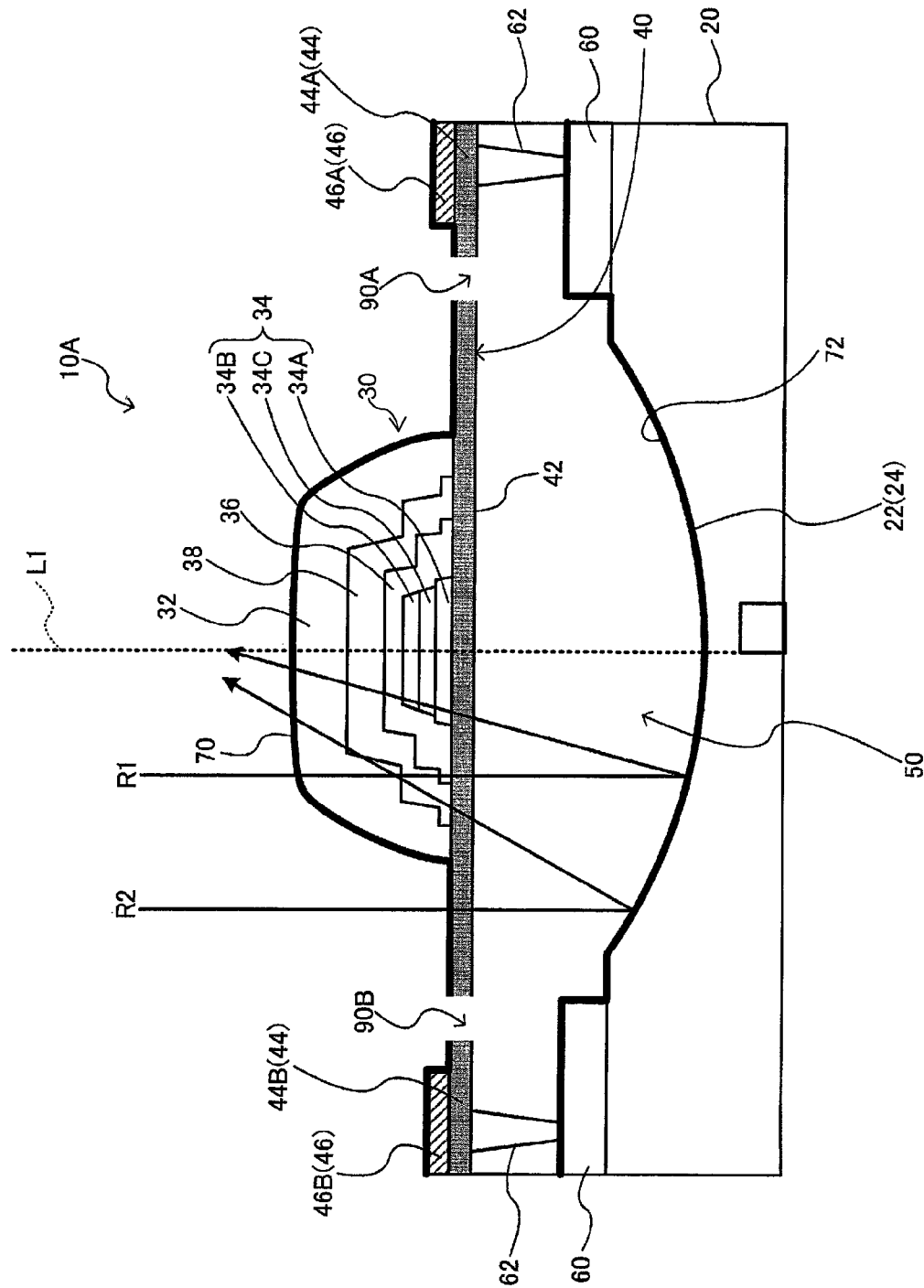
FIG. 2 is a sectional view along line II-II of FIG. 1.

FIG. 1 is a plan view showing the infrared detector according to a first embodiment of the thermal detector of the present invention, and FIG. 2 is a sectional view along line II-II of FIG. 1. The infrared detector 10A represents one cell, and an infrared detection device can be formed by arranging single cells of infrared detectors in orthogonal directions in two dimensions on a substrate.

As shown in FIGS. 1 and 2, the infrared detector 10A has a concave portion 22, and includes a substrate 20 in which the bottom surface of the concave portion 22 is a light-reflecting curved surface 24; an infrared detection element (thermal detection element, broadly speaking) 30 which includes an infrared-absorbing film (light-absorbing film, broadly speaking); and a support member (membrane) 40 for supporting the infrared detection element 30. The film having the highest absorption of the light to be detected among the films constituting the infrared detection element 30 is used as a light-detecting film 32. A cavity 50 is provided between the substrate 20 and the support member 40.

In the plan view shown in FIG. 1, the light-reflecting curved surface 24 and the light-detecting film 32 overlap, and the projected area (area within the circle indicated by a dashed line in FIG. 1) of the light-reflecting curved surface 24 in plan view is larger than the light-detecting film 32 (rectangular area).

In the infrared detector 10A, incident infrared rays are absorbed by the infrared-absorbing film 32, and heat evolved by the absorbed infrared rays causes an electromotive force to occur or changes the resistance value in the infrared detection element 30, and the infrared rays can thereby be detected. At this time, the cavity 50 is present between the substrate 20, which has a large heat capacity, and the support member 40 for mounting the infrared detection element 30. The infrared detection element 30 and the substrate 20 are therefore thermally separated, and infrared rays can be detected with minimal heat loss. The cavity 50 occupied by the infrared detector 10A of one cell is the rectangular region shown in FIG. 2, and may be 30×30 μm in size, for example.

The infrared rays incident on the infrared detector 10A of one cell include an infrared ray R1 which passes through the infrared-absorbing film 32, an infrared ray R2 which is not originally incident on the infrared-absorbing film 32, and other rays, as shown in FIG. 2. The presence of these infrared rays R1, R2 and other rays which are not absorbed by the infrared-absorbing film 32 reduces the sensitivity of the infrared detector 10A.

Therefore, in the present embodiment, these infrared rays R1, R2 and other infrared rays not absorbed by the infrared-absorbing film 32 among the directly incident infrared rays are reflected by the light-reflecting curved surface 24 of the substrate 20 via the cavity 50 and directed to the infrared-absorbing film 32 from the direction opposite the incidence direction of the infrared rays via the cavity 50. The infrared rays R1, R2 and other rays in FIG. 1 are thus also absorbed by the infrared-absorbing film 32, and the amount of heat evolved based on the incident infrared rays is increased. The sensitivity of detection by the infrared detector 10A can thereby be enhanced. The cavity 50 can be used as an optical guide path as well as for thermal separation between the support member 40 and the substrate 20.

Specifically, the support member 40 may have a mounting member 42 for mounting the infrared detection element 30, and at least one arm 44, e.g., two arms 44A, 44B, one end of which is linked to the mounting member 42, and the other end of which is supported on the substrate 20 side. The mounting member 42 and the arms 44 are formed from a material which transmits infrared rays. The two arms 44A, 44B may form wiring layers 46 (46A, 46B) which are connected to the thermal detection element. A configuration may be adopted in which a single arm 44 is provided, and the wiring layers 46A, 46B are formed in a single arm 44.

The arms 44 (44A, 44B) may be disposed outside the projected area of the light-reflecting curved surface 24 in plan view as shown in FIG. 1, but by placing the arms 44 mostly on the inside of the projected area of the light-reflecting curved surface 24 in plan view as shown in FIG. 1, the amount of area occupied by the infrared detector 10A of one cell can be reduced. When the wiring layers 46 (46A, 46B) formed in the arms 44 (44A, 44B) are made of metal, since metal reflects infrared rays, infrared rays directed toward the light-reflecting curved surface 24 are blocked.

The material forming the wiring layers 46A, 46B may therefore be a material which transmits infrared rays (incident light, broadly speaking), e.g., a transparent electrode material (ITO) or the like. Loss by the wiring layers 46 (46A, 46B) can thereby be reduced and detection sensitivity increased while still reducing the amount of area occupied by the infrared detector 10A of one cell.

In order to thermally separate the substrate 20 and the support member 40, two posts 62 are provided via spacer layers 60, for example, on the surface of the substrate 20, and the two arms 44A, 44B are supported by the two posts 62. A region that includes the space between the substrate 20 and the support member 40 can thus be created by the spacer layers 60 and the posts 62 to serve as the cavity 50. Since the support member 40 is supported on the substrate 20 via the posts 62, which have a small volume, the heat conductance of the heat transfer path from the support member 40 to the substrate 20 is low, and heat dissipation from the infrared detection element 30 including the infrared-absorbing film 32 can be reduced.

The spacer layers 60 and the posts 62 determine the height of the cavity 50 for directing the light reflected by the light-reflecting curved surface 24 toward the infrared-absorbing film 32, the spacer layers 60 are not necessarily required, and the posts 62 only may be provided.

The infrared detection element 30 is formed by a resistor layer in a case in which a bolometer-type thermal detection element is used, but a pyroelectric-type thermal detection element is used in the present embodiment. The infrared detection element 30 may therefore include a capacitor 34, as shown in FIG. 2.

The capacitor 34 includes a first electrode (lower electrode) 34A mounted on the mounting member 42, a second electrode (upper electrode) 34B disposed facing the first electrode 34A, and a ferroelectric film 34C as a pyroelectric material disposed between the first and second electrodes 34A, 34B. The first electrode 34A is connected to the wiring layer 46A, and the second electrode 34B is connected to the wiring layer 46B. The capacitor 34 spontaneously polarizes based on the heat evolution caused by infrared rays, and by retrieving the charge produced by the spontaneous polarization, the infrared rays can be detected. Examples of possible methods of infrared detection include interrupting the infrared rays by a mechanical chopper and retrieving as an alternating electrical polarization effect, or applying a polar voltage for drawing in a surface charge with respect to the orientation of the spontaneous polarization and detecting the voltage across the terminals of the capacitor, which varies according to the charge drawn after voltage application is stopped.

The sides and top of the capacitor 34 may be covered by an electrical insulation film 38 and a hydrogen barrier film 36 for preventing degradation due to reduction of the ferroelectric film 34C, for example. The infrared-absorbing film 32 is formed so as to cover the electrical insulation film 38. The surfaces of the infrared detector 10A that include the infrared-absorbing film 32, the support member 40, and the wiring layers 46 are covered by an upper protective film 70 which functions as a mask layer during formation of the cavity 50 by etching.

The concave portion 22 and light-reflecting curved surface 24 formed in the substrate 20 will next be described with reference to FIG. 2. The bottom surface of the concave portion 22 may be formed by a spherical surface, a parabolic surface, or a curved surface which more closely resembles a parabolic surface than a spherical surface. The circle defining the cross-section of the spherical surface is a curved surface in which the distance from the center coordinate (0, 0) is a constant 'a,' and can be expressed by the equation $x^2+y^2=a^2$. The parabola defining the cross-section of the parabolic surface having the coordinates (0, 0) as the vertex can be expressed by the equation $y=x^2/4f$, where (0, f) are the focus coordinates.

When the bottom surface of the concave portion 22 is a spherical surface, infrared rays incident on the concave portion 22 are reflected toward the normal line L1 of the substrate 20, which passes through the center of the infrared detection element 30, as shown in FIG. 2. When the light-absorbing film 32 is provided partway in the reflection path as shown in FIG. 2, the reflected light can be absorbed by the light-absorbing film 32. When the bottom surface of the concave portion 22 is a parabolic surface, since light incident on the parabolic surface is reflected toward a single point (focus), a parabolic surface is an ideal shape for the bottom surface of the concave portion 22. However, in a case in which the concave portion 22 is formed by isotropic etching of the substrate 20, it is difficult to accurately process the bottom surface of the concave portion 22 into a parabolic shape, as described above. The bottom surface of the concave portion 22 may therefore be a curved surface in which the curvature decreases the farther away from the longitudinal center line of the concave portion in a longitudinal section. When a curved surface is formed in which the curvature decreases the farther away from the longitudinal center line of the concave portion in a longitudinal section, a curved surface can be formed that more closely resembles a parabolic surface than a spherical surface.

A case in which the bottom surface of the concave portion 22 is a spherical surface and a case in which the bottom surface of the concave portion 22 is a parabolic surface will be compared. When (1/r) is the curvature of the spherical surface, and k is the curvature of the parabola ($y=ax^2$) in the longitudinal section of the parabolic surface, $k=2a/(1+2ax)^{3/2}$. According to this equation, the parabola in the longitudinal section of the parabolic surface is positioned as one curve in which the curvature decreases the farther away from the longitudinal center line of the concave portion 22. Even in a case in which the bottom surface of the phase control dimmer 2 cannot be processed into an accurate parabolic surface, when the curved surface is one in which the curvature thereof decreases the farther away from the longitudinal center line of the concave portion 22 in a longitudinal section, the curved surface can be assumed to more closely resemble a parabolic surface than a spherical surface.

The substrate 20 is preferably made of a material which reflects infrared rays and is suitable for isotropic etching, and in the present embodiment, the substrate 20 is a silicon substrate. The bottom surface of the concave portion 22 of the silicon substrate 20 can be used as the light-reflecting curved surface 24 for reflecting infrared rays.

In the present embodiment, a lower protective film 72 may be furthermore formed as at least one planarizing layer on the bottom surface of the concave portion 22 of the silicon substrate 20. The bottom surface of the etched concave portion 22 of the silicon substrate 20 sometimes has minute irregularities which cause light to reflect diffusely. The lower protective film 72 is capable of flattening the minute irregularities of the bottom surface of the concave portion 22 and reducing diffuse reflection. The light-reflecting curved surface 24 in this case may be the bottom surface of the concave portion 22 in which the irregularities have been flattened, and/or the surface of the lower protective film 72. The reason for this is that infrared rays may sometimes be reflected even by the surface of the lower protective film 72.

1.2 Method for Manufacturing the Infrared Detector (1) Isotropic Etching Step

FIGS. 3A through 3G show the steps of manufacturing the infrared detector 10A shown in FIGS. 1 and 2. First, a mask layer (not shown) is formed on the surface of the substrate 20, and the silicon substrate 20 is subjected to isotropic etching, as shown in FIG. 3A. Isotropic etching of silicon can be performed by wet etching using hydrofluoric acid (HF) or a fluoronitric acid or other etching solution in which hydrofluoric acid (HF) and nitric acid ($HNO_3$) are mixed, as well as by dry etching. Dry etching methods include introducing the etching gas $XeF_2$ to a wafer placed in an etching chamber. This etching gas is capable of gas etching without the need for plasma excitation. According to Japanese Laid-open Patent Publication No. 2002-113700, for example, $XeF_2$ can be used for etching at a pressure of 5 kPa. The vapor pressure of $XeF_2$ is about 4 Torr, etching is possible at or below the vapor pressure, and an etching rate of 3 to 4 μm/min can be anticipated. Besides these methods, ICP etching may also be used. Using a gas mixture of $SF_6$ and $O_2$, for example, the chamber internal pressure is set to 1 to 100 Pa, and an RF power of about 100 W is fed. In FIG. 3A, a first concave portion 21 which is hemispherical, for example, is formed in the silicon substrate 20 by isotropic etching.

(2) Substrate Processing Step

The substrate having the first concave portion 21 is then processed, and a second concave portion 22 (concave portion, broadly speaking) shallower than the first concave portion 21 is formed, as shown in FIG. 3B. In the present embodiment, the step of processing the substrate 20 involves cutting away a flat surface 20A (see FIG. 3A) of the isotropically etched substrate in which the first concave portion 21 is opened, to the position of a flat surface 20B. This processing can be performed using CMP (chemical mechanical polishing), for example. Through this processing, the silicon substrate 20 having an initial thickness of about 400 μm, for example, is formed into a substrate 20 having a thickness of about 100 μm and a concave portion 22 having the necessary depth of about 2 μm, for example. In the present embodiment, the bottom surface of the concave portion 22 is a spherical surface obtained by isotropic etching of the substrate 20. The bottom surface of the concave portion 22 having a smaller depth than the first concave portion 21, the concave portion 22 being obtained by further processing the substrate 20 having the first concave portion 21 obtained by isotropic etching, is a spherical surface having the necessary range, in which most of the unnecessary spherical surface forming the hemispherical portion is cut away.

(3) Lower Protective Film (Planarizing Film Also Serving as Etching Stop Film)

Formation Step

The spacer layers 60 are then formed on the flat surface 20B of the substrate 20, and the lower protective film 72 is formed so as to cover the entire area of the surface side of the substrate 20, i.e., the bottom surface of the concave portion 22, the flat surface 20B, and the spacer layers 60, as shown in FIG. 3C. The spacer layers 60 are formed by insulation films or the like of $SiO_2$ or the like obtained by thermal oxidation of the silicon substrate 20. The lower protective film 72 may be formed by an SiN film, $SiO_2$ film, or other film having a thickness of about 0.2 μm.

When the flatness was evaluated using a two-dimensional ellipsometer (HEUREKA HR4000K), the flatness of the bottom surface of the concave portion 22 prior to formation of the lower protective film 72 was RMS=100 nm. In a case in which a 0.2 μm SiN film is formed as the lower protective film 72, the surface of the lower protective film 72 has a high degree of flatness, RMS=10 nm.

(4) Step of Forming Sacrificial Layer and Other Layers

A sacrificial layer 80, the posts 62, a support layer 40A from which the support member 40 originates, and the wiring layers 46 are then formed on the silicon substrate 20, as shown in FIG. 3D. The sacrificial layer 80 is first formed on the lower protective film 72. When SiN, which functions as a stop film during etching of the sacrificial layer 80, is used as the material of the lower protective film 72, $SiO_2$, for example, can be used as the material of the sacrificial layer 80, which has a higher selection ratio with respect to a specific etchant than SiN.

After the surface of the sacrificial layer 80 has been flattened and holes for forming the posts 62 are formed, the posts 62 are formed in embedded fashion. The posts 62 may have a single-layer structure of alumina ($Al_2O_3$) or another aluminum oxide ($AlO_x$), for example, a two-layer structure with an $Al_2O_3$ outer layer and an $SiO_2$ inner layer, or another structure. The posts 62 have a height of about 2 μm, for example.

The support layer 40A from which the support member 40 originates is formed on the sacrificial layer 80. The support layer 40A is formed of SiN, for example, having a thickness of about 1 μm, for example. The support layer 40A is also formed over the entire surface of the sacrificial layer 80 and is not patterned at this time.

The wiring layers 46 are then formed on the support layer 40A. In FIG. 1, the wiring layers 46A, 46B on the first and second arms 44A, 44B are shown as the wiring layers 46, but in the present step, the wiring layers 46A, 46B on the arms 44A, 44B (the arms not having been patterned, and still in the form of the support layer 40A) are formed at this time. The wiring layers 46 include layers that are connected to the subsequently formed first electrode 34A and second electrode 34B, and wiring connected to the first electrode 34A as the lower electrode is formed in the step shown in FIG. 3D. The wiring layers 46 may be formed of Ti/TiN layers, Al layers, or another metal, but in order to ensure optical transparency as described above, the wiring layers 46 may be formed by transparent electrodes (ITO). The wiring layers 46 are patterned using a photolithography step after being formed to a film thickness of about 0.2 µm, for example.

(5) Step of Forming the Capacitor of the Infrared Detection Element

The infrared detection element 30 is then formed in the region of the support layer 40A that corresponds to the mounting member 42 shown in FIG. 1, as shown in FIG. 3E. In the present embodiment, since the infrared detection element 30 is a pyroelectric-type detection element, the light-absorbing film 32 and the capacitor (pyroelectric-type detection element) 34 are formed. The capacitor 34 is formed as a laminate structure which includes the first electrode (lower electrode) 34A mounted on the region corresponding to the mounting member 42, the second electrode (upper electrode) 34B disposed facing the first electrode 34A, and the ferroelectric film 34C as a pyroelectric material disposed between the first and second electrodes 34A, 34B. The first and second electrodes 34A, 34B may be formed in a three-layer structure of iridium (Ir), iridium oxide ($IrO_x$), and platinum (Pt) formed by sputtering, for example, in sequence from the position farthest from the ferroelectric film 34C. A $TiAlN_3$ (titanium aluminum nitride) layer or other layer may also be provided as a base layer for the first electrode 34A. The ferroelectric film 34C may be provided by forming a film of PZT (Pb(Zi, $Ti)O_3$, lead zirconate titanate) by a sol-gel method, sputtering, MOCVD, or another method. The first and second electrodes 34A, 34B each have a film thickness of about 0.4 µm, for example, and the ferroelectric film 34C has a film thickness of about 0.1 µm, for example.

(6) Step of Forming the Light-Absorbing Film and Upper Protective Film

The hydrogen barrier film 36 and electrical insulation film 38, for example, are each then formed so as to cover the sides and top of the capacitor 34, as shown in FIG. 3F. The hydrogen barrier film 36 is formed by sputtering, CVD, or another method using alumina ($Al_2O_3$ or another aluminum oxide ($AlO_x$), for example. The electrical insulation film 38 electrically insulates the capacitor 34 in order to form the wiring layers connected to the second electrode 34B of the capacitor 34. Although not shown in the drawing, a contact hole is formed in the top of the hydrogen barrier film 36 and the electrical insulation film 38, a plug is embedded in the contact hole, and a wiring layer formed in the shape of the electrical insulation film 38 is connected to the plug. This wiring layer is connected to the wiring layer 46B, for example, of FIG. 1. The wiring layers 46A, 46B formed in FIG. 1 may also be formed after the electrical insulation film 38 is formed.

The light-absorbing film 32 is furthermore formed so as to cover the electrical insulation film 38. The light-absorbing film 32 may be formed by $SiO_2$, SiN, SiCn, TiN, or another material, for example, so as to have a film thickness of about 2 µm, for example.

The upper protective film 70 is then formed so as to cover the entire surface of the infrared detector 10A, which includes the light-absorbing film 32, the electrical insulation film 38, the support layer 40A, and the wiring layers 46. The upper protective film 70 is formed by SiN, for example, so as to have a film thickness of about 0.2 µm, for example, the same as the lower protective film 72.

(7) Step of Patterning the Support Member and Forming the Thermal Separation Cavity The support layer 40A is then patterned, and the support member 40 having the mounting member 42 and the first and second arms 44A, 44B as shown in FIG. 1 is formed. This step is performed by isotropic etching of the SiN, for example, as the material forming the support layer 40A. This isotropic etching can be performed by covering the region of the mounting member 42 and the first and second arms 44A, 44B with a mask layer and using an etching gas in which nitrogen or chlorine is added to a gas mixture of $CF_4$ and oxygen, for example, or an etching gas in which nitrogen is added to a gas mixture of fluorine and oxygen (see Japanese Laid-open Patent Publication No. 10-261616, for example).

Through this isotropic etching, an opening in which the underlying sacrificial layer 80 is exposed is formed in the region outside the mounting member 42 and first and second arms 44A, 44B shown in FIG. 1, and two openings 90A, 90B are formed as shown in FIG. 2, which is a sectional view along line II-II of FIG. 1, for example.

Lastly, the openings including the openings 90A, 90B are utilized as etching holes to remove the underlying sacrificial layer 80 by isotropic etching (see FIG. 3G). This isotropic etching can be performed by wet etching using hydrofluoric acid (HF). At this time, the surface of the infrared detector 10A is covered by the upper protective film (e.g., SiN) 70 except for the etching holes, and the upper protective film 70 is used as a mask layer during isotropic etching. Since the upper protective film (e.g., SiN) 70 is formed on at least the bottom surface of the concave portion 22 of the substrate 20, the lower protective film 72 can be used as an etching stop film for isotropic etching.

The etching holes are not limited to being formed by patterning the support member 40. For example, a plurality, e.g., four, etching holes 92, 94, 96, 98 may be formed in localized fashion in the region outside the mounting member 42 and arms 44A, 44B prior to patterning of the support member 40, as shown in FIG. 1. In this case, the support member 40 is patterned after isotropic etching of the sacrificial layer 80.

2. Second Embodiment

2.1 Structure of the Infrared Detector

Figure 4:
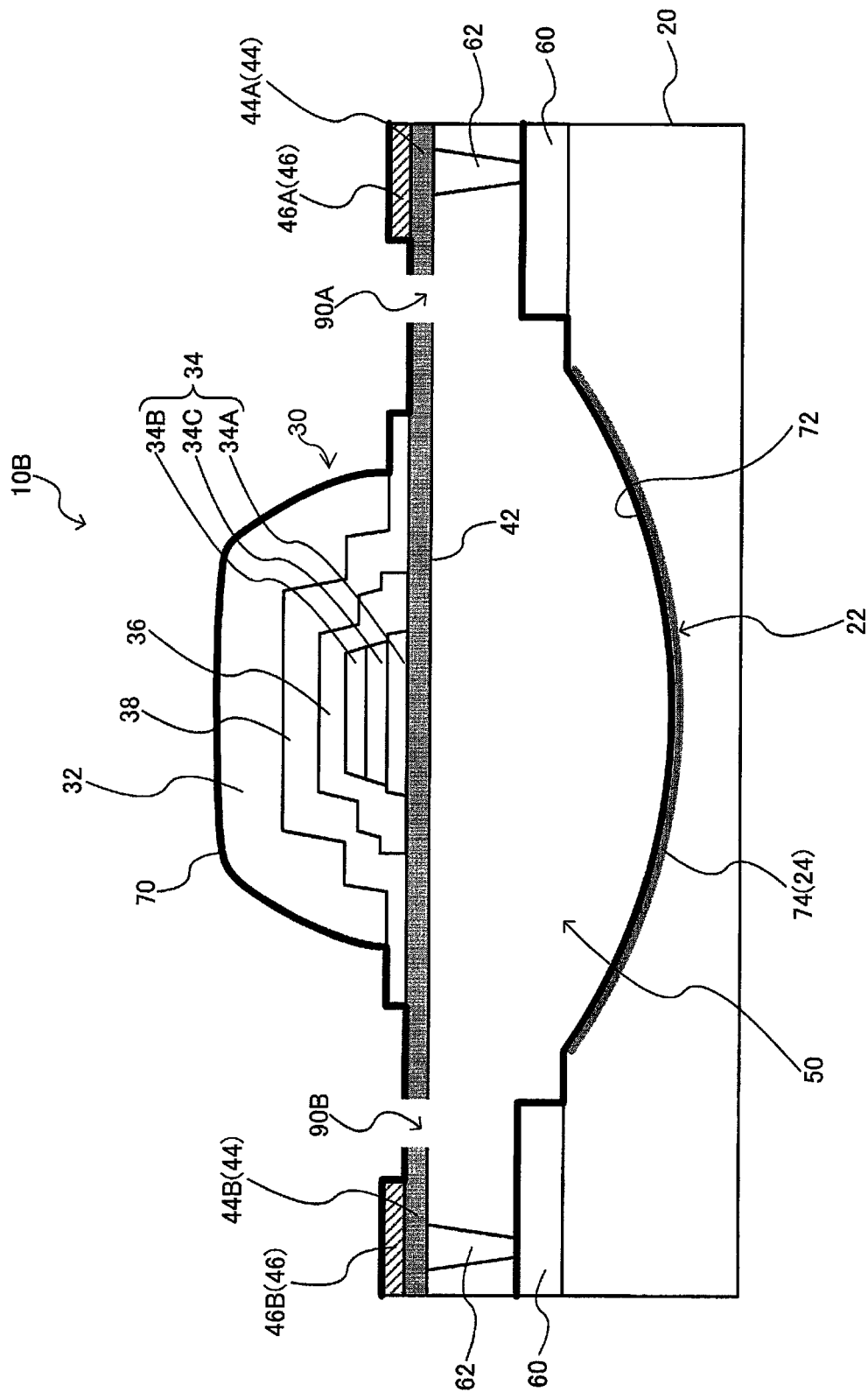
FIG. 4 is a sectional view showing the infrared detector according to a second embodiment of the present invention.

The infrared detector 10B according to a second embodiment shown in FIG. 4 differs from the infrared detector 10A of the first embodiment in that the at least one planarizing film formed on the bottom surface of the concave portion 22 of the substrate 20 has a two-layer structure including a reflecting film 74 as a lower layer and the lower protective film 72 as an upper layer, as shown in FIG. 4. The reflecting film 74 of the lower layer has a higher reflectance of infrared rays than the silicon substrate 20. In other words, the surface of the reflecting film 74 functions as a specular surface having fewer irregularities than the minutely irregular surface of the bottom surface of the concave portion 22 formed by etching the silicon substrate 20.

In the present embodiment, the light-reflecting curved surface 24 of the concave portion 22 becomes the surface of the reflecting film 74 which takes an active role in reflection, and because diffuse reflection is further reduced, the sensitivity of detection by the infrared detector can be further enhanced. A base film may be furthermore formed on the bottom surface of the concave portion 22 in order to improve adhesion of the metal reflecting film 74 to the substrate 20. Since the lower protective film 72 is also formed so as to cover the reflecting film 74, the lower protective film 72 can be made to function as an etching stop film during etching of the sacrificial layer 80, the same as in the first embodiment.

2.2 Method for Manufacturing the Infrared Detector

Figure 5A:
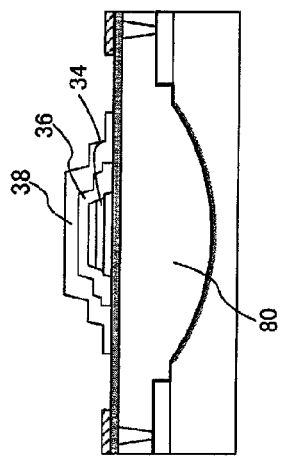
FIGS. 5A through 5H are views showing the steps of manufacturing the infrared detector shown in FIG. 4.
Figure 5B:
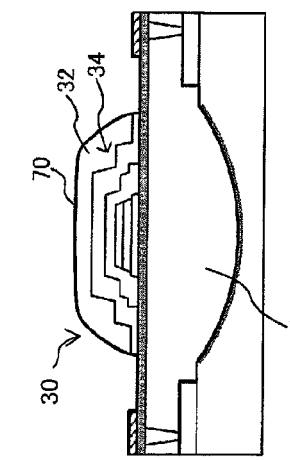
Figure 5F:
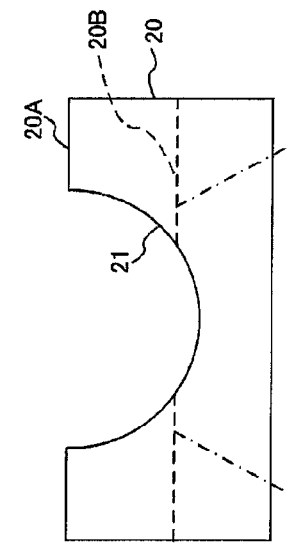
Figure 5G:
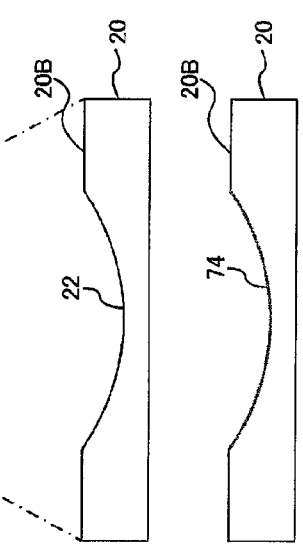
Figure 5C:
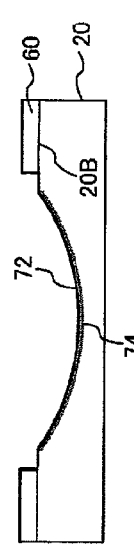

The manufacturing method of the present embodiment is shown in FIGS. 5A through 5H. The manufacturing method of the present embodiment differs from the first embodiment in that the reflecting film formation step shown in FIG. 5C is added between the steps shown in FIGS. 3B and 3C of the first embodiment, but the other steps are essentially the same as in the first embodiment. The reflecting film 74 shown in FIG. 5C may be formed of a metal, e.g., Al, Ag, Pt, or another metal, and is formed by sputtering to obtain a film thickness of about 0.2 μm, for example. It is sufficient insofar as the reflecting film 74 is formed only on the bottom surface of the concave portion 22, and the region in which the reflecting film is not formed is masked or removed by etching after sputtering on the entire surface.

Figure 5D:
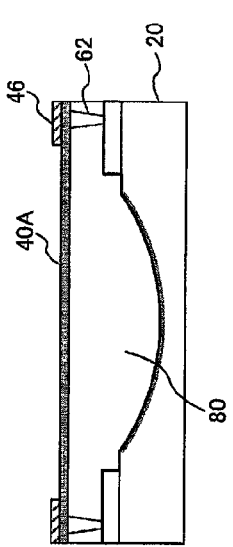
Figure 5E:
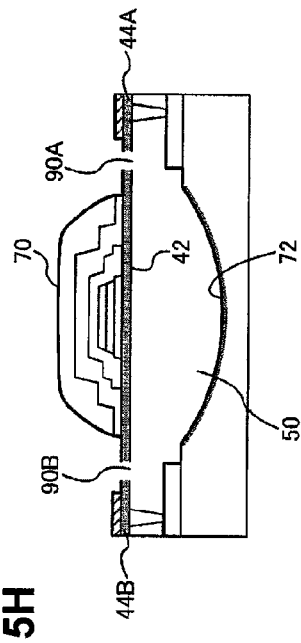
Figure 5H:
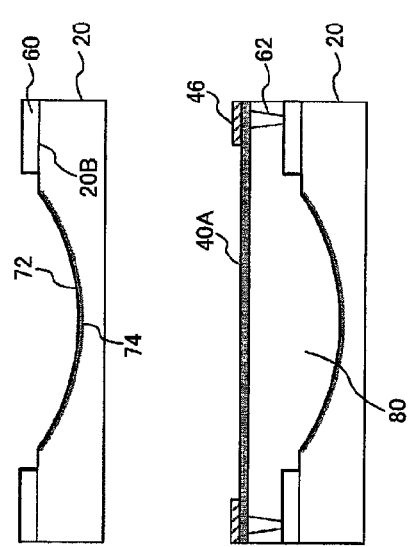

FIG. 5D shows the step of forming the lower protective film 72, the same as FIG. 3C, but the lower protective film 72 is formed overlapping the reflecting film 74 in FIG. 5D. Except for the presence of the reflecting film 74, FIGS. 5E through 5H are essentially the same as FIGS. 3D through 3G.

3. Third Embodiment

3.1 Structure of the Infrared Detector

Figure 6:
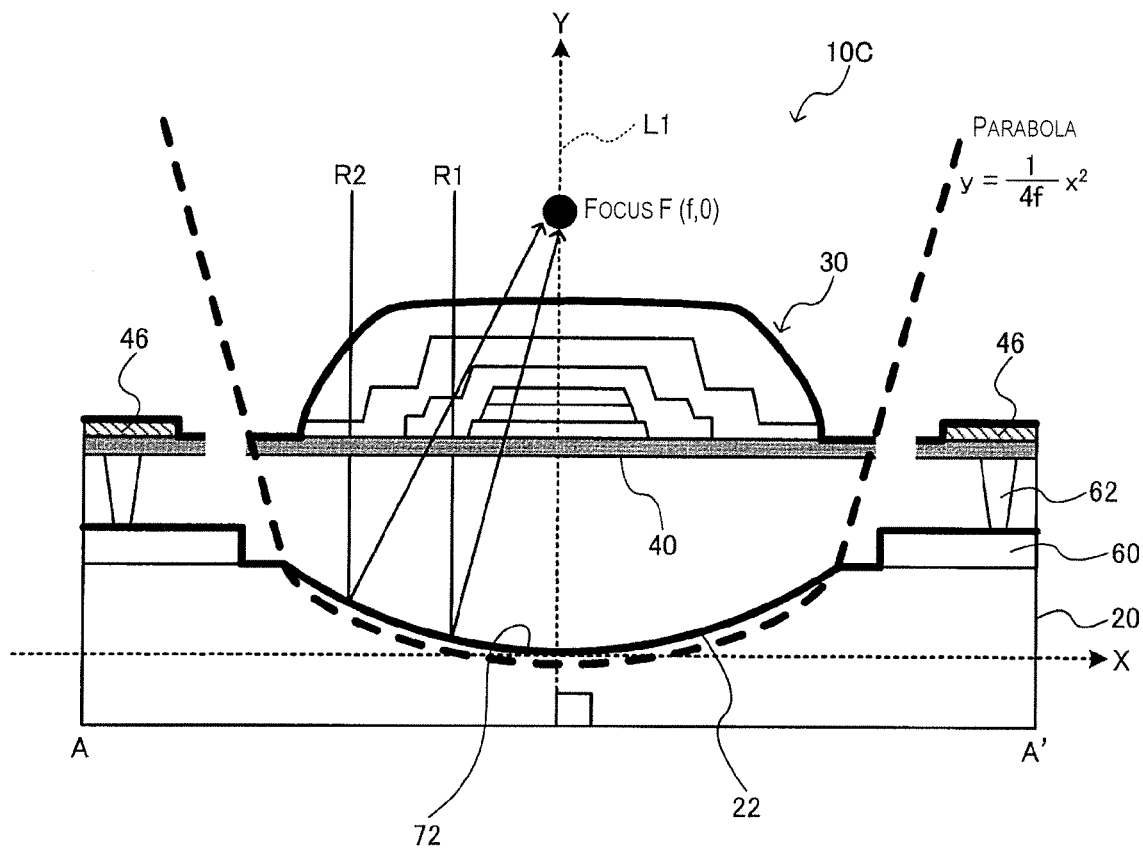
FIG. 6 is a sectional view showing the infrared detector according to a third embodiment of the present invention.
Figure 7A:
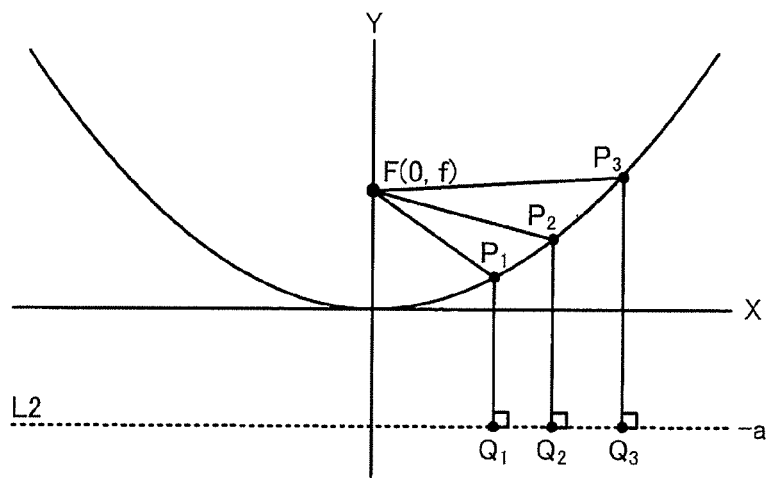
FIGS. 7A and 7B are diagrams for explaining a parabola.

The infrared detector 10C according to the third embodiment shown in FIG. 6 differs from the infrared detector 10A of the first embodiment with respect to the shape of the bottom surface of the concave portion 22. In FIG. 6, the bottom surface of the concave portion 22 defines a parabolic surface rather than a spherical surface. As shown in FIG. 7A, when the directrix L2 (y=−f) parallel to the X-axis orthogonal to the Y axis, and the focus F (y=f) on the Y-axis are given, the parabola forming the parabolic surface is given as the trajectory of the point P in which the point Q is present on the directrix L2 having a distance PQ equal to the distance PF from point P to the focus F.

The trajectory of point P (x, y) is as shown below from the Pythagorean theorem in the right triangle FPR where R is the intersection of the Y-axis and a perpendicular line drawn to the Y-axis from point P.

$$(y+f)^2 = x^2 + (f-y)^2 \quad (1)$$

When Equation (1) is modified, the parabola having the x, y coordinates (0, 0) as the vertex is given by the following function as the trajectory of point P (x, y).

$$y = x^2/4f \quad (2)$$

Figure 7B:
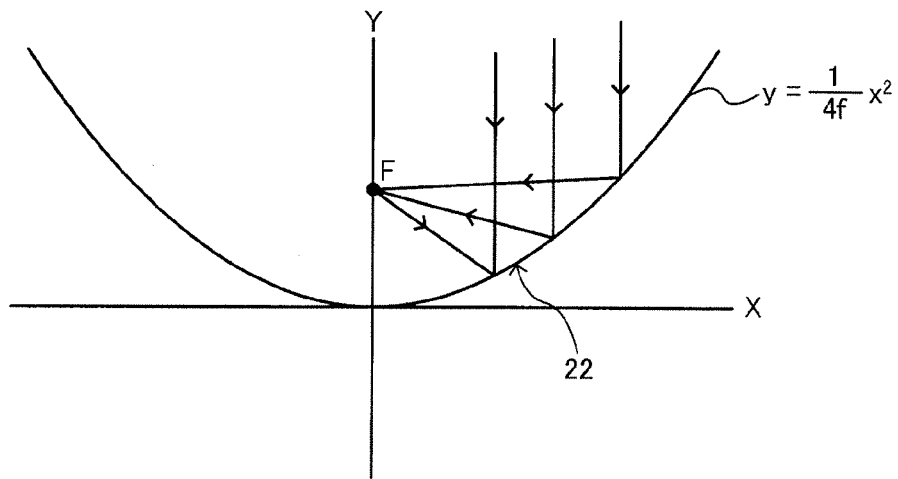

Light that is incident parallel to the Y-axis is disposed to be reflected by the parabolic surface so as to collect at the focus F of the parabolic surface, as shown in FIG. 7B.

In the present embodiment, as shown in FIG. 6, the vertical-axis center line of the infrared detection element 30 is the Y-axis, the bottom surface of the concave portion 22 is a parabolic surface with the vertex at the coordinates (0, 0), and reflected light is collected at the focus F (0, f) positioned further toward the light-incident side than the infrared-absorbing film 32, and infrared rays can thereby be efficiently absorbed by the infrared-absorbing film 32 partway in the incidence path of the reflected light. The value of f may be set to about 2 to 10 μm.

3.2 Method for Manufacturing the Infrared Detector

The manufacturing method of the present embodiment is shown in FIGS. 8A through 8F. The manufacturing method of the present embodiment differs from the first embodiment in that the steps of the first embodiment shown in FIGS. 3A and 3B are shown consolidated in FIG. 8A, but the other steps are essentially the same as in the first embodiment.

Figure 8A:
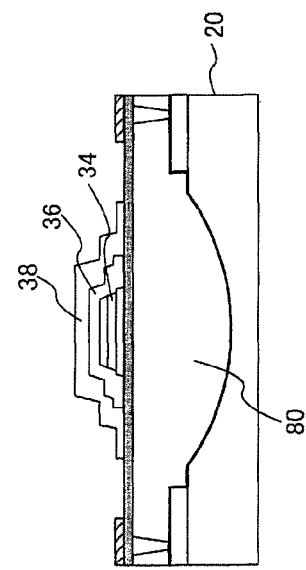
FIGS. 8A through 8F are views showing the steps of manufacturing the infrared detector shown in FIG. 6.
Figure 8B:
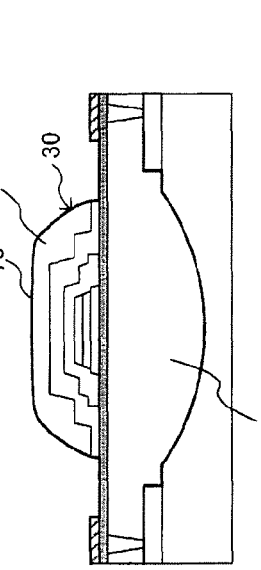
Figure 8C:
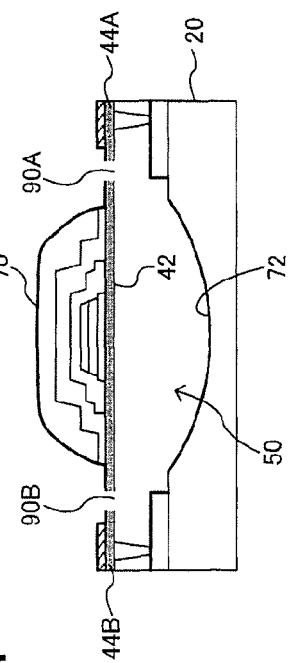
Figure 8D:
Figure 8E:
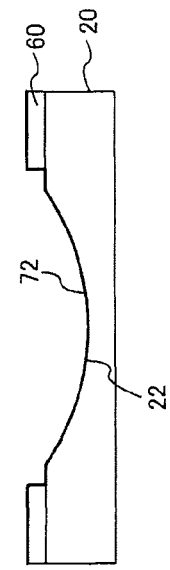
Figure 8F:
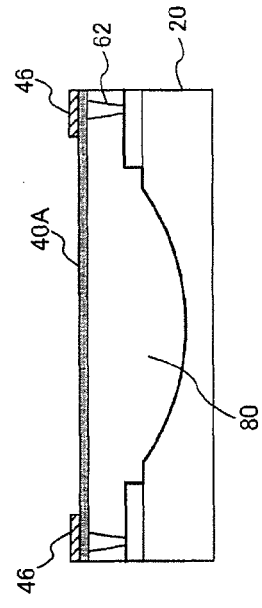

In FIG. 8A, the bottom surface of the concave portion 22 of the silicon substrate 20 is formed into the parabolic surface described above or a curved surface which more closely resembles a parabolic surface than the spherical surface of the first embodiment. An example of the steps of forming the concave portion 22 is described with reference to FIGS. 9A through 9D.

FIGS. 9A through 9D show the isotropic etching step referred to as time-multiplexed plasma etching. This time-multiplexed plasma etching is published in K. Wang, K. F. Bohringer, "Time-multiplexed plasma-etching of high numerical aperture paraboloidal micromirror arrays," CLEO/Pacific Rim 2003.15-19 Dec. 2003. Vol. 1, p. 317.

Figure 9A:
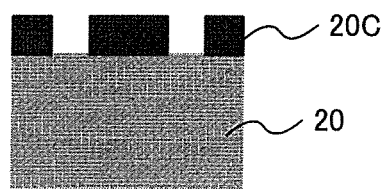
FIGS. 9A through 9D are views showing a manufacturing process as an example of processing the parabolic surface shown in FIG. 5A.
Figure 9B:
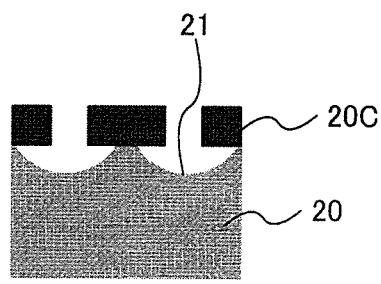
Figure 9C:
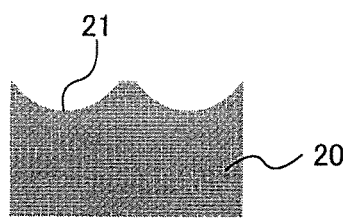
Figure 9D:
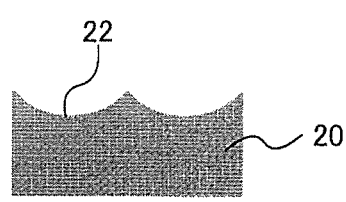

First, a mask layer 20C is formed on the silicon substrate 20 as shown in FIG. 9A, and isotropic etching is performed for 35 minutes using $SF_6$ plasma, for example, to obtain the first concave portion 21 as shown in FIG. 9B. The mask layer 20C is then removed as shown in FIG. 9C, the silicon substrate 20 without the mask layer is subjected to further isotropic etching for 15 minutes using $SF_6$ plasma, for example, and the concave portion 22 is obtained. The concave portion 22 having a smaller depth than the first concave portion 21, the concave portion 22 being obtained by further processing the substrate 20 which has the first concave portion 21 obtained by the isotropic etching step, can be formed into a parabolic surface or a curved surface which more closely resembles a parabolic surface than a spherical surface.

4. Fourth Embodiment

4.1 Structure of the Infrared Detector

Figure 10:
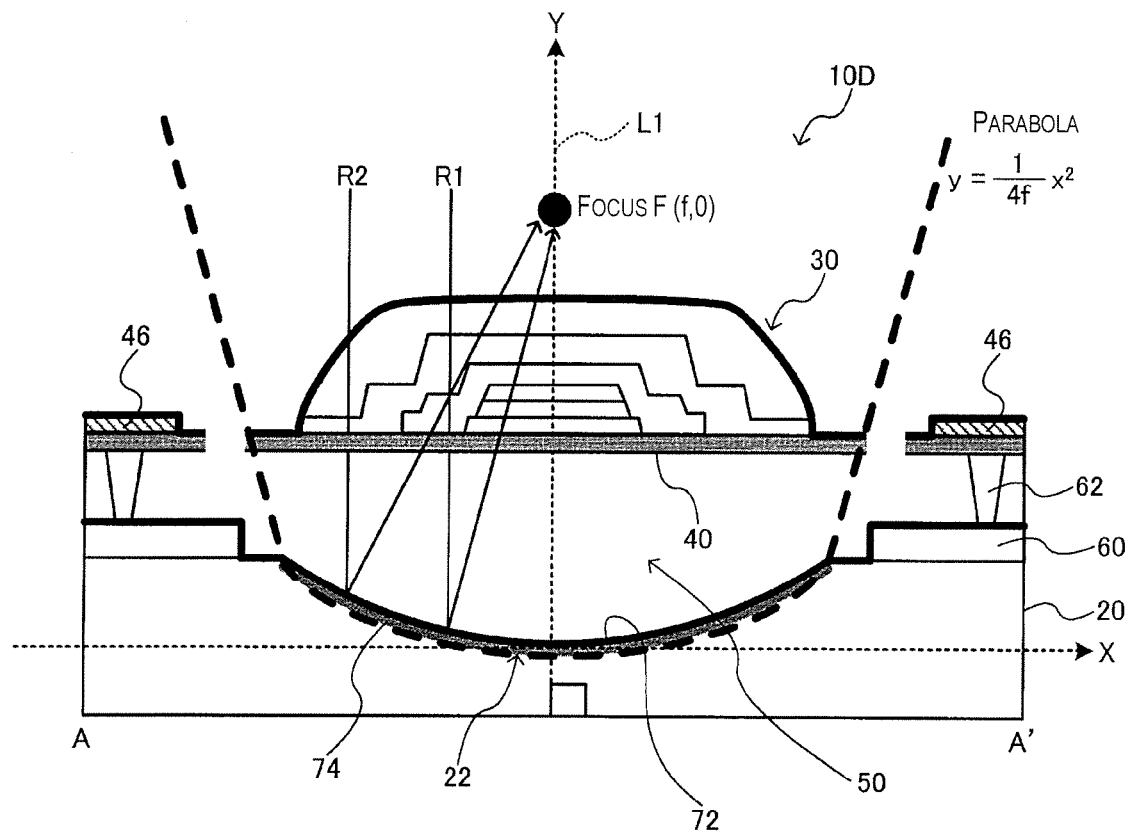
FIG. 10 is a sectional view showing the infrared detector according to a fourth embodiment of the present invention.

The infrared detector 10D according to a fourth embodiment shown in FIG. 10 differs from the infrared detector 10C of the third embodiment in that the at least one planarizing film formed on the bottom surface of the concave portion 22 of the substrate 20 has a two-layer structure including the reflecting film 74 as a lower layer and the lower protective film 72 as an upper layer, as shown in FIG. 10. The reflecting film 74 of the lower layer is the same as that of the second embodiment.

Through the fourth embodiment, by making the concave portion 22 a parabolic surface or a curved surface which more closely resembles a parabolic surface than a spherical surface, and providing the reflecting film 74 as the light-reflecting curved surface, reflected light and other light directed toward the focus F of the parabolic surface can be efficiently directed to the light-absorbing film 32, and the sensitivity of the infrared detector 10D can be further enhanced.

4.2 Method for Manufacturing the Infrared Detector

The manufacturing method of the present embodiment is shown in FIGS. 11A through 11G. The manufacturing method of the present embodiment differs from the third embodiment in that the reflecting film formation step shown in FIG. 11B is added between the steps of the third embodiment shown in FIGS. 9A and 9B, but the other steps are essentially the same as in the third embodiment. The step of forming the reflecting film 74 can be performed by the same method as in the second embodiment.

Several embodiments are described above, but it is readily apparent to one skilled in the art that numerous modifications are possible which do not substantively depart from the new matter and effects of the present invention. All such modifications are therefore included in the scope of the present invention. For example, terms which appear at least once together with different terms which are broader or synonymous in sense in the Specification or drawings can be substituted with the different terms in any part of the Specification or drawings.

The present invention is broadly applicable to thermal detectors and is applicable not only to pyroelectric thermal detectors but to bolometer-type thermal detectors as well. The object of detection is also not limited to infrared rays, and may also be light from other wavelength regions.

A thermal detector of one cell may be used as an infrared sensor or other sensor, or the thermal detector of one cell may be arranged along orthogonal axes in two dimensions to form a thermal detection device, in which case a heat (light) distribution image can be provided. This thermal detection device can be mounted in an electronic instrument for thermography, automobile navigation, a surveillance camera, or another application.

5. Fifth Embodiment

Figure 12:
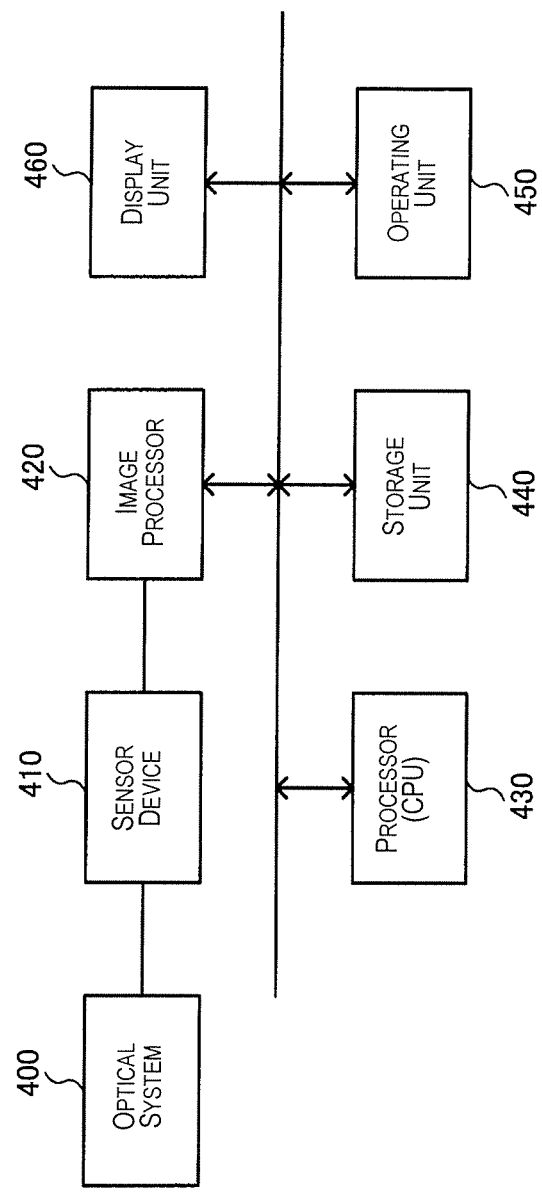
FIG. 12 is a block diagram showing an electronic instrument which includes the thermal detector or thermal detection device.

FIG. 12 shows an example of the configuration of an electronic instrument which includes the thermal detector or thermal detection device of the present embodiment. The electronic instrument includes an optical system 400, a sensor device (thermal detection device) 410, an image processor 420, a processor 430, a storage unit 440, an operating unit 450, and a display unit 460. The electronic instrument of the present embodiment is not limited to the configuration shown in FIG. 12, and various modifications thereof are possible, such as omitting some constituent elements (e.g., the optical system, operating unit, display unit, or other components) or adding other constituent elements.

The optical system 400 includes one or more lenses, for example, a drive unit for driving the lenses, and other components. Such operations as forming an image of an object on the sensor device 410 are also performed. Focusing and other adjustments are also performed as needed.

The sensor device 410 is formed by arranging the optical detector of the present embodiment described above in two dimensions, and a plurality of row lines (word lines, scan lines) and a plurality of column lines (data lines) are provided. In addition to the optical detector arranged in two dimensions, the sensor device 410 may also include a row selection circuit (row driver), a read circuit for reading data from the optical detector via the column lines, an A/D converter, and other components. An object image can be captured by sequentially reading data from optical detectors arranged in two dimensions.

The image processor 420 performs image correction processing and various other types of image processing on the basis of digital image data (pixel data) from the sensor device 410.

The processor 430 controls the electronic instrument as a whole and controls each block within the electronic instrument. The processor 430 is realized by a CPU or the like, for example. The storage unit 440 stores various types of information and functions as a work area for the processor 430 or the image processor 420, for example. The operating unit 450 serves as an interface for operation of the electronic instrument by a user, and is realized by various buttons, a GUI (graphical user interface) screen, or the like, for example. The display unit 460 displays the image acquired by the sensor device 410, the GUI screen, and other images, for example, and is realized by a liquid crystal display, an organic EL display, or other types of display.

A thermal detector of one cell may thus be used as an infrared sensor or other sensor, or the thermal detector of one cell may be arranged along orthogonal axes in two dimensions to form the sensor device 410, in which case a heat (light) distribution image can be provided. This sensor device 410 can be used to form an electronic instrument for thermography, automobile navigation, a surveillance camera, or another application.

As shall be apparent, one cell or a plurality of cells of thermal detectors may also be used in an object analysis instrument (measurement instrument) for analyzing (measuring) physical information of an object, in a security instrument for detecting fire or heat, in an FA (factory automation) instrument provided in a factory or the like, and in various other electronic instruments.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:
1. A thermal detector comprising:
a substrate having a concave portion, the concave portion having a bottom surface that is a parabolic surface and forms a light-reflecting curved surface;
a thermal detection element including a light-absorbing film; and
a support member supporting the thermal detection element with a cavity being provided between the substrate and the support member, the thermal detection element defining partially an outer periphery of the thermal detector at a side opposite the substrate relative to the support member along a normal line of the substrate that passes through a center of the thermal detection element, the light-reflecting curved surface and the light-absorbing film overlapping each other in plan view, the parabolic surface having an area larger than an area of the light-absorbing film in plan view, the parabolic surface being curved so that incident light is reflected by the parabolic surface and traveled through the light-absorbing film toward a focus point positioned on the normal line of the substrate and positioned at an outer side relative to the outer periphery of the thermal detector defined by the thermal detection element.

2. The thermal detector according to claim 1, further comprising at least one planarizing film formed on the bottom surface of the concave portion, a flatness of the at least one planarizing film is greater than a flatness of the bottom surface of the concave portion.

3. The thermal detector according to claim 2, wherein the at least one planarizing film includes an etching stopper film used when a sacrificial layer disposed in the concave portion is removed by etching.

4. The thermal detector according to claim 2, wherein the at least one planarizing film includes a reflecting film having a higher reflectance of the incident light than the substrate.

5. The thermal detector according to claim 1, wherein the support member includes
- a mounting member mounting the thermal detection element, and
- at least one arm, one end of which is linked to the mounting member, and the other end of which is supported by the substrate, and
a wiring layer connected to the thermal detection element is formed in the at least one arm, the wiring layer being made of material which passes incident light.

6. A thermal detection device comprising:
the thermal detector according to claim 1 arranged in two dimensions along two orthogonal axes.

7. An electronic instrument comprising the thermal detector according to claim 1.

8. An electronic instrument comprising the thermal detection device according to claim 6.

9. The thermal detector according to claim 1, wherein the light-absorbing film has an overall shape in which a width along a direction perpendicular to the normal line of the substrate decreases as a distance from the support member along the normal line of the substrate increases.

* * * * *